(12) United States Patent
Schwartz

(10) Patent No.: US 11,852,977 B2
(45) Date of Patent: *Dec. 26, 2023

(54) APPARATUS AND METHODS OF ELECTRICALLY CONDUCTIVE OPTICAL SEMICONDUCTOR COATING

(71) Applicant: Danbury Mission Technologies, LLC, Colorado Springs, CO (US)

(72) Inventor: Bradley Dean Schwartz, Brewster, NY (US)

(73) Assignee: Danbury Mission Technologies, LLC, Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/208,958

(22) Filed: Mar. 22, 2021

(65) Prior Publication Data

US 2022/0043355 A1    Feb. 10, 2022

Related U.S. Application Data

(62) Division of application No. 16/166,788, filed on Oct. 22, 2018, now Pat. No. 10,955,747, which is a
(Continued)

(51) Int. Cl.
*G03F 7/32* (2006.01)
*C23C 14/48* (2006.01)
(Continued)

(52) U.S. Cl.
CPC ............... *G03F 7/32* (2013.01); *C23C 14/48* (2013.01); *G02B 1/11* (2013.01); *G02B 1/14* (2015.01);
(Continued)

(58) Field of Classification Search
CPC ..... B32B 3/08; B32B 3/10; G03F 7/32; G03F 7/20; G02B 1/11; G02B 1/14; H01L 23/552; H01L 31/0216
See application file for complete search history.

(56) References Cited

U.S. PATENT DOCUMENTS

| 3,566,829 A | 3/1971 | Hill |
| 4,074,139 A | 2/1978 | Pankove |

(Continued)

FOREIGN PATENT DOCUMENTS

| CN | 105529355 A | 4/2016 |
| EP | 438398 A1 | 7/1991 |

(Continued)

OTHER PUBLICATIONS

Extended European Search Report dated Jan. 29, 2018, issued during the prosecution of European Patent Application No. EP 17190049.1 (10 pages).
(Continued)

*Primary Examiner* — Elizabeth E Mulvaney
(74) *Attorney, Agent, or Firm* — Fish & Richardson P.C.

(57) ABSTRACT

A method of coating an optical substrate with a transparent, electrically conductive coating includes depositing a semiconductor coating over a surface of an optical substrate, wherein the semiconductor coating has broadband optical transmittance. A doped semiconductor is applied in a pattern over the semiconductor coating. The doped semiconductor in the pattern is activated for electrical conductivity in the doped semiconductor.

20 Claims, 2 Drawing Sheets

Related U.S. Application Data division of application No. 15/259,400, filed on Sep. 8, 2016, now Pat. No. 10,126,656.

(51) Int. Cl.

| | | |
|---|---|---|
| *G02B 1/11* | (2015.01) | |
| *G02B 1/14* | (2015.01) | |
| *G03F 7/20* | (2006.01) | |
| *H01L 31/0216* | (2014.01) | |
| *H01L 23/552* | (2006.01) | |

(52) U.S. Cl.
CPC .............. *G03F 7/20* (2013.01); *H01L 23/552* (2013.01); *H01L 31/0216* (2013.01)

(56) References Cited

U.S. PATENT DOCUMENTS

| | | |
|---|---|---|
| 4,152,824 A | 5/1979 | Gonsiorawski |
| 4,255,474 A | 3/1981 | Smith, Jr. |
| 5,173,443 A | 12/1992 | Biricik et al. |
| 5,488,371 A | 1/1996 | Targove |
| 5,546,204 A | 8/1996 | Ellis |
| 6,521,913 B1 | 2/2003 | Murade |
| 7,557,769 B2 | 7/2009 | Picard et al. |
| 9,236,157 B2 | 1/2016 | Kuznetsov et al. |
| 9,276,034 B2 | 3/2016 | Zmek et al. |
| 9,952,355 B1 | 4/2018 | Schwartz |
| 10,126,656 B2 | 11/2018 | Schwartz |
| 10,228,495 B2 | 3/2019 | Schwartz |
| 10,955,747 B2 * | 3/2021 | Schwartz .................. G03F 7/20 |
| 2005/0266162 A1 | 12/2005 | Luo et al. |
| 2007/0212861 A1 | 9/2007 | Chidambarrao et al. |
| 2012/0204950 A1 | 8/2012 | Magdassi et al. |
| 2014/0272314 A1 | 9/2014 | Veerasamy |
| 2015/0289424 A1 | 10/2015 | Zmek et al. |
| 2015/0349141 A1 | 12/2015 | Jiang |
| 2016/0035756 A1 | 2/2016 | Jiang et al. |

FOREIGN PATENT DOCUMENTS

| | | |
|---|---|---|
| EP | 1944807 A1 | 7/2008 |
| JP | S5498189 | 8/1979 |
| JP | H2114243 | 4/1990 |
| JP | H04504027 | 7/1992 |
| JP | 2007220818 | 8/2007 |
| JP | 2007529884 | 10/2007 |
| JP | 2009283777 | 12/2009 |
| JP | 2016086164 | 5/2016 |
| KR | 101361440 | 2/2014 |
| WO | WO 199004189 | 4/1990 |
| WO | 2009/086161 A1 | 7/2009 |
| WO | 2010082652 | 7/2010 |

OTHER PUBLICATIONS

P. Janicek et al. Applied Surface Science 421 (2017) 557-564.
European Communication Pursuant to Article 94(3) EPC, dated Jan. 23, 2020, issued during the prosecution of European Patent Application No. EP 17190049.1.
Office Action in Japanese Appln. No. 2021-187653, dated Jan. 10, 2023, 8 pages (with English translation).
Office Action in Japanese Appln. No. 2021-187653, dated Sep. 10, 2023, 10 pages (with English translation).

* cited by examiner

APPARATUS AND METHODS OF ELECTRICALLY CONDUCTIVE OPTICAL SEMICONDUCTOR COATING

CROSS-REFERENCE TO RELATED APPLICATIONS

This application is a divisional of application of U.S. patent application Ser. No. 16/166,788, filed Oct. 22, 2018, which claims the benefit of priority to U.S. patent application Ser. No. 15/259,400, filed Sep. 8, 2016, which is incorporated by reference herein in its entirety.

BACKGROUND OF THE INVENTION

1. Field of the Invention

The present disclosure relates to optics, and more particularly to electrically conductive coatings for broadband optics.

2. Description of Related Art

Electro-optic (EO) systems require windows to protect the sensor and electronics from outside elements. In addition to rain, dust, and the like, in many cases the window must also block electromagnetic interference (EMI) that would otherwise impede the EO system performance.

EMI shielding can be accomplished with a window that is electrically conductive and optically transparent. There are three conventional types of shielding.

The first type of EMI shielded window uses a semiconductor material such as silicon or germanium that is doped with a group V element such as phosphorous, arsine, or antimony to supply additional electrons to provide electrical conductivity. These windows are opaque for visible wavelengths and are thus not useful for broadband EO systems.

The second type of shielded window uses a continuous, transparent, conductive coating. These coatings consist of wide bandgap semiconductors such as indium oxide ($In_2O_3$) and zinc oxide (ZnO) that have broadband optical transparency. The semiconductors are doped to provide electrical conductivity. However, as doping increases to increase electrical conductivity and EMI attenuation, optical transmittance decreases. This effect begins at longer wavelengths where both plasma reflectance and free-carrier absorption from electrons decrease transmittance. Traditional transparent, conductive semiconductor coatings are practical only in the 0.4 to 2.0 micron range, short wavelength visible through short wavelength infrared, (SWIR).

The third type of shielded window is traditionally required for broadband applications from the visible to the long-wave infrared (LWIR). A grid of fine metal lines is applied on the surface of the window. Typical dimensions are 5-micron wide lines with 140 micron spacing. These gridded windows enable optical transmittance over a broad wavelength range, but they limit optical transmittance by obscuration and scattering.

U.S. Pat. No. 9,276,034 presents a method for reducing the optical scattering from a conductive grid. Channels are etched into a window substrate, and an electrically conductive semiconductor is deposited in the channels such that the surface of the window is planar. The semiconductor is transparent for visible and short wavelength infrared (SWIR) wavelengths but reflecting and absorbing for mid wavelength infrared (MWIR) and longer wavelengths. Using a semiconductor with an index of refraction close to that of the substrate minimizes light scattering from the grid lines.

The conventional techniques have been considered satisfactory for their intended purpose. However, there is an ever present need for improved electrically conductive optical coatings for broad band optics. This disclosure provides a solution for this problem.

SUMMARY OF THE INVENTION

A method of coating an optical substrate includes depositing a semiconductor coating over a surface of an optical substrate, wherein the semiconductor coating, e.g., an undoped semiconductor coating, has broadband optical transmittance. Portions of the semiconductor coating are doped to form a pattern of doped semiconductor in the semiconductor coating. The doped semiconductor in the pattern is activated for electrical conductivity.

Doping the semiconductor coating to form a pattern can include applying a photoresist over the semiconductor coating. The photoresist can be selectively exposed and developed in the pattern. The semiconductor coating can be doped through openings in the photoresist. The photoresist can be removed to leave the doped semiconductor in the pattern on the semiconductor coating.

Doping the semiconductor coating to form a pattern can include at least one of applying dopant by ion implantation or applying dopant by thin film coating. The pattern can be configured to provide electromagnetic interference (EMI) shielding to the optical substrate. The pattern can include a grid. Activating the doped semiconductor can include at least one of heat-treating or laser annealing the doped semiconductor.

A protective coating can be applied over the semiconductor coating and doped semiconductor pattern before activating the doped semiconductor. The method can include depositing a broadband anti-reflection coating over the protective coating. It is also contemplated that the method can include depositing a broadband anti-reflection directly coating over the semiconductor coating and doped semiconductor.

The semiconductor coating can include at least one of $In_2O_3$ or ZnO. The doped semiconductor can include at least one of Sn, Mo, W, Ti, Al, or Ga. The semiconductor coating can have broadband optical transmittance in at least visible and infrared spectra. Depositing the semiconductor coating can include depositing the semiconductor coating with the semiconductor coating undoped. Doping the semiconductor coating and activating the doped semiconductor can include diffusing the doped semiconductor through the semiconductor coating to the optical substrate.

Depositing a semiconductor coating can include depositing the semiconductor coating over a surface of the optical substrate in its entirety. Doping the semiconductor coating to form a pattern can include doping a surface of the semiconductor coating so a surface of the semiconductor coating is covered in its entirety with the pattern.

The activated doped semiconductor, semiconductor coating, and optical substrate can be formed into a window without etching. The activated doped semiconductor, semiconductor coating, and optical substrate can be formed into a window without polishing or post-process planarization. The activated doped semiconductor and semiconductor coating can have closely matched indices of refraction to mitigate light scattering.

A window can be produced by any embodiment of the processes described above. A window includes a transparent substrate with a coating over the transparent substrate, the coating being made of both a transparent semiconductor and an electrically conductive semiconductor, the electrically conductive semiconductor being distributed in a pattern in the transparent semiconductor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
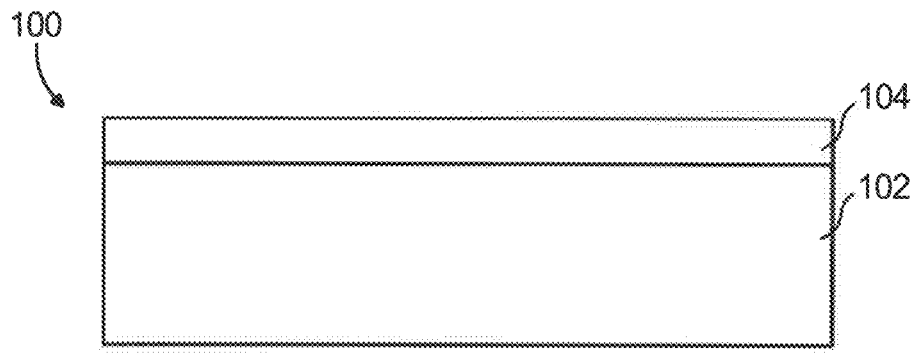
FIG. 1 is a schematic cross-sectional elevation view of an exemplary embodiment of an optic constructed in accordance with the subject disclosure, showing the semiconductor coating with broadband optical transmittance deposited over the surface of the optical substrate.

Reference will now be made to the drawings wherein like reference numerals identify similar structural features or aspects of the subject disclosure. For purposes of explanation and illustration, and not limitation, a partial view of an exemplary embodiment of an optic in accordance with the disclosure is shown in FIG. 1 and is designated generally by reference character 100. Other embodiments of optics in accordance with the disclosure, or aspects thereof, are provided in FIGS. 2-5, as will be described. The systems and methods described herein can be used to provide electrically conductive coatings on optics such as windows, wherein the coatings have broadband optical transmittance.

A method of coating an optical substrate 102 with a transparent, electrically conductive coating includes depositing a semiconductor coating 104 over a surface of an optical substrate, wherein the semiconductor coating has broadband optical transmittance. The semiconductor coating 104 can include at least one of Indium Oxide ($In_2O_3$) or Zinc Oxide (ZnO). The semiconductor coating 104 can have broadband optical transmittance in at least visible and infrared spectra such as long wave infrared, for example. Depositing the semiconductor coating 104 can include depositing the semiconductor coating with the semiconductor coating undoped. Depositing the semiconductor coating 104 can include depositing the semiconductor coating over a surface of the optical substrate 102 in its entirety, e.g., the top surface of optical substrate 102 as oriented in FIG. 1.

Figure 2:
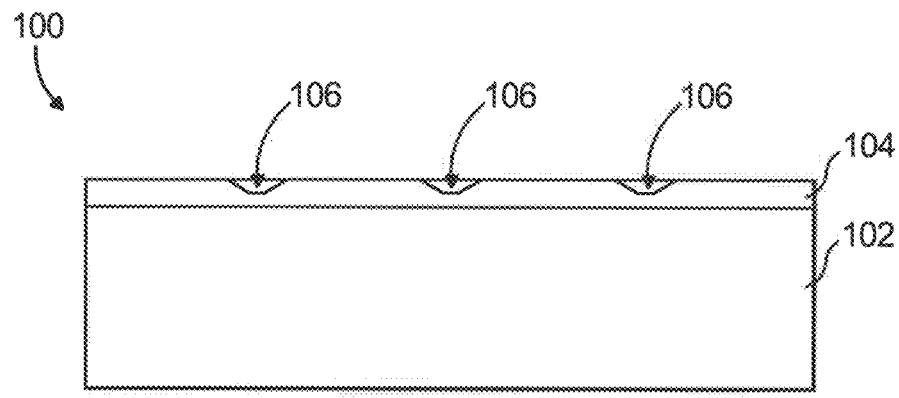
FIG. 2 is a schematic cross-sectional elevation view of the optic substrate of FIG. 1, showing dopant atoms applied in a pattern to the semiconductor coating.

With reference now to FIG. 2, the semiconductor coating 104 is doped to form a pattern 108 (shown in FIG. 5) of doped semiconductor 106 in the semiconductor coating 104. Doping the semiconductor coating 104 to form a pattern 108 can include at least one of applying the dopant by ion implantation, applying the dopant by thin film coating, or by any other suitable process. The doped semiconductor can include at least one of Sn, Mo, W, Ti, Al, Ga, or any other suitable material for electrical conductivity. For example, if the semiconductor coating 104 includes undoped $In_2O_3$, the doped semiconductor 106 can include $In_2O_3$ doped with Sn, Mo, W, or Ti. In another example, if the semiconductor coating 104 includes undoped ZnO, the doped semiconductor 106 can include ZnO doped with Al or Ga.

Figure 3:
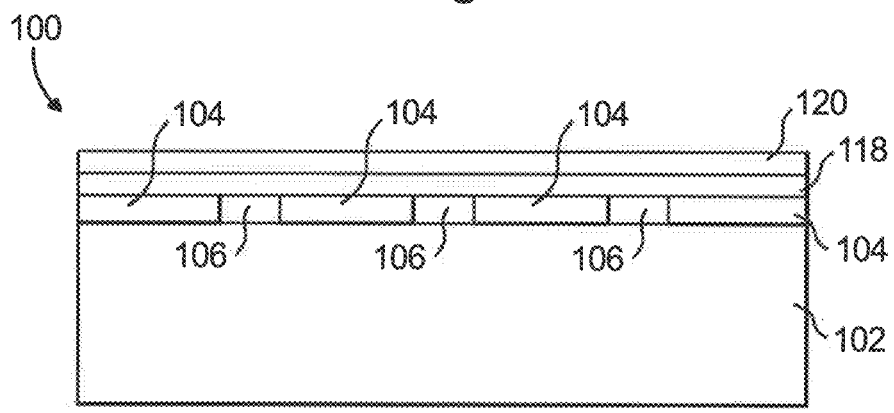
FIG. 3 is a schematic cross-sectional elevation view of the optic of FIG. 1, showing the doped semiconductor diffused and activated in the semiconductor coating.

Referring now to FIG. 3, the doped semiconductor 106 in the pattern 108 is activated for electrical conductivity in the doped semiconductor 106, e.g., to increase the electrical conductivity of doped semiconductor 106 after it is applied to semiconductor coating 104. Activating the doped semiconductor 106 can include at least one of heat-treating or laser annealing the doped semiconductor 106. Doping the semiconductor coating 104 and activating the doped semiconductor 106 can include diffusing the doped semiconductor through the semiconductor coating 106 to the optical substrate 102, as shown in FIG. 3.

Figure 4:
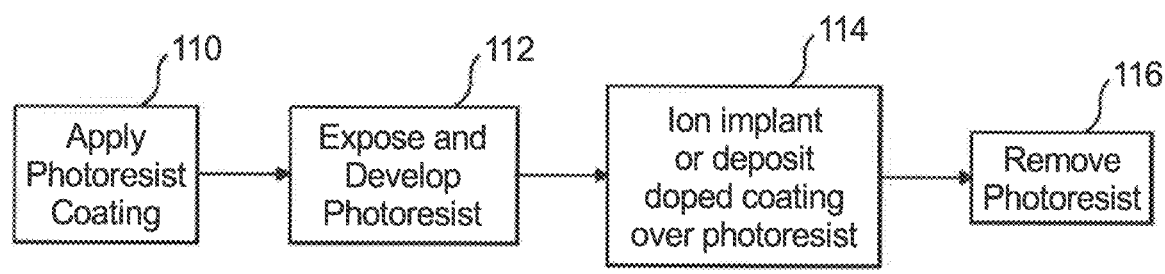
FIG. 4 is a flow diagram of an exemplary embodiment of a process in accordance with the subject disclosure, showing a process for applying doped semiconductor in a pattern using photoresist.
Figure 5:
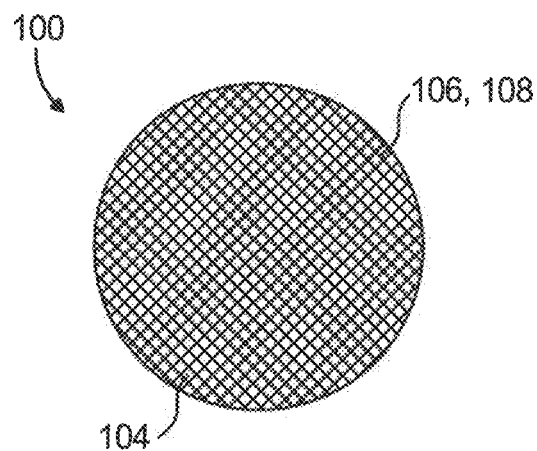
FIG. 5 is a schematic plan view of the optical substrate in FIG. 1, showing an exemplary grid pattern.

With reference now to FIG. 4, doping the semiconductor coating to form a pattern 108 can include applying a photoresist over the semiconductor coating 102, as indicated by box 110. As indicated by box 112 in FIG. 4, the photoresist can be selectively exposed and developed in the pattern 108 that is shown in FIG. 5. The dopant can be applied to the semiconductor coating 104 through openings in the photoresist, as indicated by box 114 in FIG. 4, e.g., by ion implanting or depositing doped coating over the photoresist. The photoresist can then be removed to leave the doped semiconductor in the pattern 108 on the semiconductor coating 104, as indicated by box 116 in FIG. 4.

Referring now to FIG. 5, the pattern 108 of doped semiconductor 106 can be configured to provide electromagnetic interference (EMI) shielding to the optical substrate, e.g., in any suitable grid pattern. For example, for EMI shielding a broadband optic with a grid having optical transmittance in visible and long wave infrared, a square grid with 5-micron wide lines with 140 micron spacing between the grid lines can be used. Doping the semiconductor coating 104 to form the pattern 108 can include doping a surface of the semiconductor coating 104 so that surface of the semiconductor coating 104 is covered in its entirety with the pattern 108 as shown in FIG. 5. The grid pattern 108 shown in FIG. 5 is schematic and is not necessarily to scale.

With reference again to FIG. 3, a protective coating 118 can be applied over the semiconductor coating 104 and doped semiconductor 106 before activating the doped semiconductor 106. The method can include depositing a broadband anti-reflection coating 120 over the protective coating 118. It is also contemplated that a broadband anti-reflection coating 120 can be applied directly over the semiconductor coating 104 and doped semiconductor 106, e.g., omitting protective coating 118. Although illustrated as a single layer, the broadband anti-reflection coating can consist of multiple layers.

The activated doped semiconductor 106, semiconductor coating 104, and optical substrate 102 can be formed into an optic 100, e.g., a window, that has an electrically conductive coating for EMI shielding, heating, or the like, without etching. The activated doped semiconductor 106, semiconductor coating 104, and optical substrate 102 can be formed into finished optic 100, such as a window, without polishing or post-process planarization because the surface of optic 100 is already smooth after the pattern 108 is formed. The activated doped semiconductor 106 and semiconductor coating 104 have closely matched indices of refraction to mitigate visible and near infrared light scattering through the grid pattern. If the ratio of the indices of refraction of the doped semiconductor and semiconductor coating is between 0.82 and 1.22, the interface reflection will be less than 1% at normal incidence. For example, the indices of refraction of doped and undoped $In_2O_3$ at 632.8 nm are about 2.00 and 1.77, respectively. The index ratio of 1.13 produces a reflection of only 0.37%.

The methods and systems of the present disclosure, as described above and shown in the drawings, provide for electrically conductive coatings with superior properties including broadband optical transmittance. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A window, comprising:
   a transparent substrate;
   a coating disposed over a portion of the transparent substrate, the coating comprising a first plurality of regions formed of a transparent semiconductor, and a second plurality of regions formed of an electrically conductive semiconductor.

2. The window as recited in claim 1, wherein the semiconductor coating has a broadband optical transmittance.

3. The window as recited in claim 1, wherein the second plurality of regions form a grid pattern within the coating.

4. The window as recited in claim 1, further comprising a protective coating disposed over the semiconductor coating.

5. The window as recited in claim 4, further comprising a broadband anti-reflection coating disposed over the protective coating.

6. The window as recited in claim 1, further comprising a broadband anti-reflection coating disposed over the semiconductor coating.

7. The window as recited in claim 1, wherein the first plurality of regions comprise at least one member selected from the group consisting of $In_2O_3$ and ZnO.

8. The window as recited in claim 1, wherein the second plurality of regions comprise doped portions of the semiconductor coating.

9. The window as recited in claim 8, wherein the doped portions of the semiconductor coating comprise at least one dopant selected from the group consisting of Sn, Mo, W, Ti, Al, and Ga.

10. The window as recited in claim 1, wherein the semiconductor coating has a broadband optical transmittance in at least visible and infrared spectral regions.

11. The window as recited in claim 1, wherein the second plurality of regions form a regular pattern in a surface of the semiconductor coating.

12. The window as recited in claim 1, wherein the semiconductor coating and transparent substrate are formed into a window without etching.

13. The window as recited in claim 1, wherein the semiconductor coating and transparent substrate are unpolished and unplanarized in the window.

14. The window as recited in claim 1, wherein the first plurality of regions have a first index of refraction and the second plurality of regions have a second index of refraction different from the first index of refraction.

15. The window as recited in claim 1, wherein the second plurality of regions are positioned in the coating to provide electromagnetic interference (EMI) shielding to the transparent substrate.

16. The window as recited in claim 14, wherein a ratio of the first index of refraction to the second index of refraction is between 0.82 and 1.22.

17. The window as recited in claim 1, wherein the second plurality of regions form a plurality of linearly extending domains within the coating.

18. The window as recited in claim 8, wherein the doped portions of the semiconductor coating comprise at least one dopant that extends through a thickness of the semiconductor coating within the doped portions.

19. The window recited in claim 1, wherein an electrical conductivity of the second plurality of regions is greater than an electrical conductivity of the first plurality of regions.

20. The window recited in claim 1, wherein the coating is integrally formed from the first plurality of regions and the second plurality of regions.

* * * * *